(12) United States Patent
Keskin

(10) Patent No.: US 10,382,011 B2
(45) Date of Patent: Aug. 13, 2019

(54) GROUNDED CAPACITANCE MULTIPLIERS WITH ELECTRONIC TUNING POSSIBILITY USING SINGLE CURRENT FEEDBACK AMPLIFIER

(71) Applicant: YEDITEPE UNIVERSITESI, Istanbul (TR)

(72) Inventor: Ali Umit Keskin, Istanbul (TR)

(73) Assignee: YEDITEPE UNIVERSITESI, Istanbul (TR)

( * ) Notice: Subject to any disclaimer, the term of this patent is extended or adjusted under 35 U.S.C. 154(b) by 0 days.

(21) Appl. No.: 15/609,034

(22) Filed: May 31, 2017

(65) Prior Publication Data

US 2018/0351536 A1    Dec. 6, 2018

(51) Int. Cl.
  *H03H 11/40*    (2006.01)
  *H03H 11/48*    (2006.01)
  *H03H 11/04*    (2006.01)

(52) U.S. Cl.
  CPC ... *H03H 11/483* (2013.01); *H03H 2011/0477* (2013.01); *H03H 2210/028* (2013.01)

(58) Field of Classification Search
  CPC ..... H03H 11/483; H03H 11/481; H03H 11/48
  USPC ......................................................... 327/524
  See application file for complete search history.

(56) References Cited

U.S. PATENT DOCUMENTS

| | | | |
|---|---|---|---|
| 3,831,117 A | 8/1974 | Fletcher et al. | |
| 3,911,296 A | 10/1975 | Davis | |
| 6,492,871 B2 | 12/2002 | Liu et al. | |
| 7,388,432 B1 | 6/2008 | van Sprakelaar | |
| 7,466,175 B2 | 12/2008 | Smith et al. | |
| 8,816,760 B2 | 8/2014 | Sung | |
| 9,236,841 B2 | 1/2016 | Ciubotaru | |
| 9,548,721 B1 | 1/2017 | Abuelma'atti et al. | |
| 2007/0090872 A1 | 4/2007 | Chen et al. | |

OTHER PUBLICATIONS

R. Arslanalp and T. Yucehan: "Capacitance multiplier design by using CFOA" (English language machine translation ).*
D.J. Comer et al.:"Bandwidth extension of high-gain CMOS stages using active negative capacitance",Proceedings of 13th IEEE International Conference on Electronics, Circuits and Systems pp. 628-631, 2006.
A. Antoniou:"Floating negative impedance converter",IEEE Trans. CT-19, p. 209-212, 1972.
R. Senani:"Floating GNIC/GNII configuration with only a single OMA", Electron. Lett. 35(6), p. 423-425, 1995.
E. Yuce, and S. Minaeri:"A modified CFOA and its applications to simulated inductors, capacitance multipliers, and analog filters", IEEE Transactions on Circuits and Systems I, 55(1), 266-275, Feb. 2008.

(Continued)

*Primary Examiner* — Metasebia T Retebo
(74) *Attorney, Agent, or Firm* — Gokalp Bayramoglu

(57) ABSTRACT

The present invention relates to a capacitance multiplier topology suitable for both positive and negative capacitance multiplication having a minimum configuration consisting of a current feedback amplifier (CFOA), two resistors and a reference capacitor, with each C-multiplier having a respective capacitance amplification constant k which is externally adjustable. Such a capacitance multiplier has less parasitic components, occupies a smaller chip area with higher simulated capacitance value.

6 Claims, 2 Drawing Sheets

(56) References Cited

OTHER PUBLICATIONS

M.T. Abuelma'atti and S.K. Dhar:"New CFOA based floating immittance emulators", International Journal of Electronics, 103, 12, 1984-1997, 2016.
A. Lahiri and M. Gupta:"Realizations of Grounded Negative Capacitance Using CFOAs", Circuits Systems and Signal Processing 30: 143-155, 2011.DOI 10.1007/s00034-010-9215-3.
R. Senani et. al.: "Current Feedback Operational Amplifiers and Their Applications", Springer Science and Business Media, New York 2013.
R. Arslanalp and T. Yucehan:"Capacitance multiplier design by using CFOA",23rd Signal Processing and Communications Applications Conference (SIU), May 16-19, 2015.
A.A. Khan:, S. Bimal, K.K. Dey, S.S. Roy:"Current conveyor based R and: C-multiplier circuits", AEU, Int. J. Electron. Commun. 56 (5), 312-316, 2002.
Eyad Abou-Allam and Ezz I. El-Masry:"A 200 MHz Steered Current Operation: al Amplifier in 1.2 µm CMOS Technology", IEEE Journal of Solid-State Circuits, vol. 32, No. 2, Feb. 1997.
S. Sakurai and M. Ismail:"A CMOS Square-Law Programmable Floating Resistor Independent of the Threshold Voltage",IEEE Trans. on Circuits and Systems, 39 (8): 565-574,Aug. 1992.
S. Al-Sarawi:"New current-controlled very high value floating CMOS resistor",Proceedings of SPIE—The International Society for Optical Engineering 4591 • Nov. 2001.
M. Kushima et.al.:"Design of a Floating Node Voltage-Controlled Linear Variable Resistor Circuit",The 47h IEEE international Midwest Symposium on Circuits and Systems,p. 85-88, 2004.

\* cited by examiner

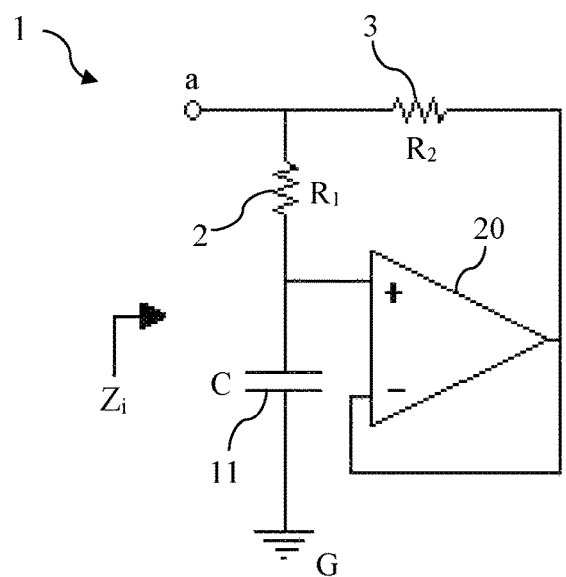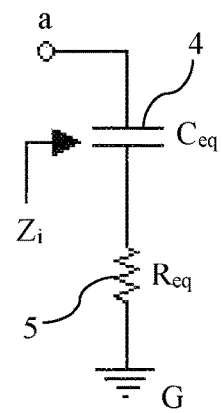
Fig. 1A
(Prior Art)
Fig. 1B
(Prior Art)
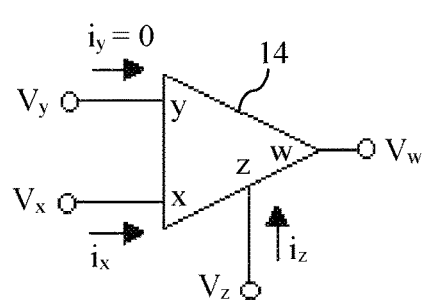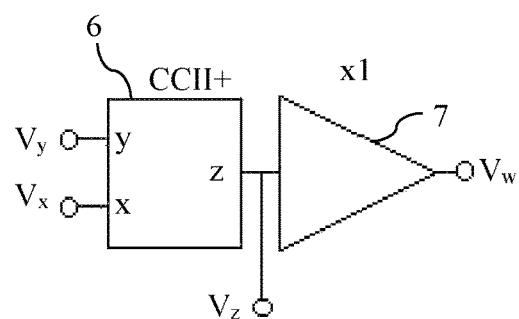
Fig. 2A
(Prior Art)
Fig. 2B
(Prior Art)

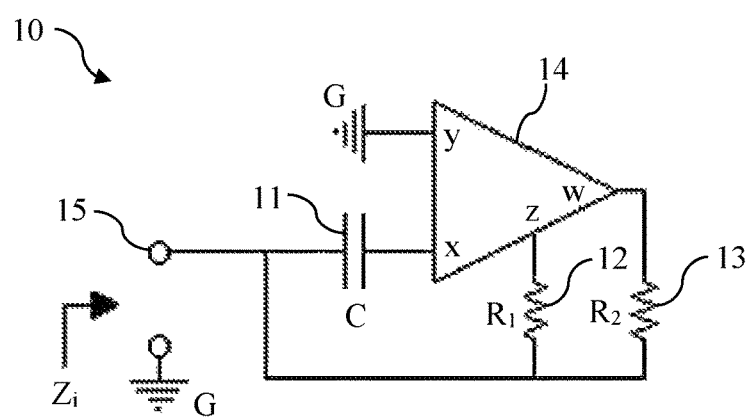
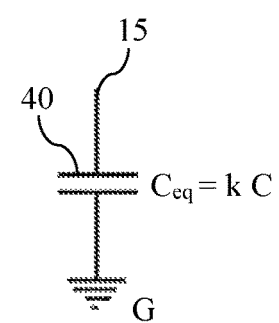
Fig. 3A                    Fig. 3B

GROUNDED CAPACITANCE MULTIPLIERS WITH ELECTRONIC TUNING POSSIBILITY USING SINGLE CURRENT FEEDBACK AMPLIFIER

FIELD OF THE INVENTION

Present invention relates generally to integrated Capacitance Multiplier circuits, and particularly to grounded Capacitance Multiplier circuits (Capacitance Amplifiers) of positive and negative simulated capacitance values using a single Current Feedback Amplifier.

BACKGROUND OF THE INVENTION

Capacitor is an electronic component that stores electric charge. In a conventional fabrication process, realization of a physically large capacitor on an integrated circuit is very costly unless special fabrication process steps have been added to implement it. Real physical capacitors with capacitance values higher than 100 pF are considered to be a physically large capacitor with unfeasible manufacturing costs. Therefore, such a physically large capacitor construction should be avoided. One solution of this problem is to employ a Capacitance Multiplier circuit in place of a real physical capacitor with excessively large capacitance value.

Capacitance multipliers can be grouped as voltage-based capacitance multipliers (e.g. Miller multipliers) and current-based capacitance multipliers.

A Miller capacitance multiplier senses a voltage through the capacitor and feeds back a voltage. A Miller capacitance multiplier requires adding additional power and circuitry such as a trans-impedance amplifier which affects the frequency response of the overall amplifier circuit. The frequency response stability of the overall circuit may be adversely affected.

In a current-based capacitance multiplier, a current through a capacitor is sensed, multiplied and fed back. In a conventional example, the multiplier circuit senses current and multiplies the current while mirroring back the current to an input node.

For example, U.S. Pat. No. 3,911,296 discloses a capacitance multiplier which comprises an integrated (Miller) capacitor structure coupled between the collector and base electrodes of an integrated NPN transistor. Effective capacitance is produced between the collector and ground having a value of $C_x=(\beta+1)C$ where is the transistor current gain, C is the Miller Capacitance. One apparent disadvantage of the circuit described by U.S. Pat. No. 3,911,296 is that the resultant capacitance is a function of the beta of the transistor which itself is process and temperature dependent. Thus, the value of the effective capacitance varies strongly due to process and temperature variations. Another disadvantage of the circuit of U.S. Pat. No. 3,911,296 is that on-chip capacitor takes up die area of the integrated circuit chip. In large scaled integrated circuits, the useable area of the integrated circuit chip becomes quite important such that elimination of the need to assign a portion of the area to fabricate "on-chip" capacitors can be a significant advantage to the circuit designer.

Some previous applications of Capacitor Multipliers in the art (such as U.S. Pat. No. 3,831,117 to Fletcher et. al) involves the employment of operational amplifiers as the active element. FIG. 1A displays an example of this kind of capacitance multiplier circuit. The circuit 1 is based on operational amplifier 20, two resistors 2, 3 and a reference capacitor 11. This circuit 1 has the advantage of using single active element (Op-amp) but has a disadvantage of being far from pure capacitance simulator.

Equivalent impedance between terminal a of this circuit 1 and ground G equals to a series connected RC circuit consisting of lossless capacitor 4 and lossy component 5, as shown in FIG. 1B. Therefore, this circuit can only simulate a lossy capacitance. This is apparent from the input impedance which is of the form $$Z_i = \frac{R_1 R_2}{R_1 + R_2} + \frac{R_2}{j\omega C(R_1 + R_2)} = R_x - jX_c \quad \text{(Equation 1)}$$

where C is the actual (physical) capacitance which is to be amplified j is the basic complex number (square root of minus 1), and ω is the angular frequency. All of these terms are well known by those who are specialized in the art.

This equation tells us that equivalent impedance consists of a series connected resistance and a capacitive reactance. Multiplier term is $$k = \frac{R_2}{R_1 + R_2} \quad \text{(Equation 2)}$$

and it equally applies to resistor $R_1$ and capacitor C, therefore yields a lossy form of a capacitance multiplier.

It should be pointed out that the resistor connected to inverting terminal of the op-amp in FIG. 1 of U.S. Pat. No. 3,831,117 has no effect on the circuit driving point impedance, and FIG. 1 presented herein differs in that sense.

More recent articles published in scientific and technical literature, and newer patents focus on modifying operational amplifier based designs of C-multipliers. For example, a C-multiplier circuit proposed by Smith et. al in U.S. Pat. No. 7,466,175 B2 is based on an opamp in conjunction with a current mirror circuit. The input of the current mirror arrangement senses the current through a small reference capacitor. The output of the current mirror arrangement is connected in parallel with the reference capacitor. The overall arrangement forms a capacitance multiplier with a multiplication factor of N+1, where N is the current gain or current gain factor of the current mirror arrangement.

Another U.S. Pat. No. 8,816,760 B2, awarded to Sung, 2014) teaches us how to implement current mirror structures and a couple of current sources to improve a C-multiplier performance in connection with an operational amplifier element. On the other hand, lossy C-multipliers involve many unwanted parasitic terms and noise sources which increase by thermal agitation. These become strongly disturbing and deteriorate the performance of monolithic integrated circuits.

Elimination of lossy terms can be possible only using additional active elements (for example, two operational amplifiers are used in U.S. Patent 20070090872 A1 2007 by Y-C Chen, Y-C Lu), however, at the cost of circuit complexity, and increased chip area.

Many previous art. C-multipliers are prone to failure in one or more of the following issues: Use of two or more active elements (such as opamps), excessive use of passive components and circuit extensions such as current mirrors or current sources in connection with the main active element, narrow bandwidth, low frequency restrictions due to parasitics, and lossy terms.

A circuit to be used for the purpose should employ minimum number of active and passive elements which is important from the point of view of integrated circuit implementation, power consumption, cost and area on the chip. Realizations of said structures would preferably be canonic in the number of passive components and do not require any critical component matching condition. After all, it will be apparent for those who are specialized in the art that the circuits presented herein fulfill these requirements.

Negative Capacitance Multipliers:

Negative capacitance multipliers (simulators) (NCM) have applications in capacitive cancellation schemes and frequency bandwidth extension techniques and to devise various filters and oscillators. Fundamental circuit topologies of NCMs are known as Negative impedance convertors (NICs).

D. J. Comer et al. describe such applications in "Bandwidth extension of high-gain CMOS stages using active negative capacitance", in Proceedings of 13th IEEE International Conference on Electronics, Circuits and Systems pp. 628-631, 2006. One of the best known previous art was reported by A. Antoniou, wherein the realized floating NIC required two op-amps and five resistors and required resistor matching "Floating negative impedance converter", IEEE Trans. CT-19, 209-212, 1972. Floating negative capacitance simulators using different active elements have been reported by R. Senani in "Floating GNIC/GNII configuration with only a single OMA". Electron. Lett. 35(6), 423-425, 1995, E. Yuce has reported several NICs for simulating grounded negative capacitors in "A modified CFOA and its applications to simulated inductors, capacitance multipliers, and analog filters", IEEE Transactions on Circuits and Systems I, 55(1), 266-275, February 2008. A paper by M. T. Abuelma'atti and S. K. Dhar introduces a circuit of a floating type negative capacitance circuit with 2 CFOAs and 3 passive elements in "New CFOA based floating immittance emulators", International Journal of Electronics, 103, 12, 1984-1997, 2016. A. Lahiri and M. Gupta have presented negative capacitance circuits using CFOAs in "Realizations of Grounded Negative Capacitance Using CFOAs", Circuits Systems and Signal Processing 30: 143-155, 2011. The negative C-multiplier circuit presented in FIG. 5 (circuit D in "Realizations of Grounded Negative Capacitance Using CFOAs". Circuits Systems and Signal Processing 30: 143-155, 2011) of Lahiri and Gupta provides an ideal negative capacitance value of $$C_{eq} = -C\frac{R_2}{2R_1} \quad \text{(Equation 3)}$$

However, r non-ideal conditions this becomes $$C_{eq} = -C\frac{R_2 - R_x}{2R_1}, \quad R_{eq} = -\frac{R_1 R_x}{R_2 - R_x} \quad \text{(Equation 4)}$$

In other words, a parasitic resistance term is included in ideal negative capacitance equation, and negative resistance term is included in the input impedance equation of their proposed circuit.

So far, none of previous art C-multipliers have implemented Y terminal of the CFOA in grounded form. Therefore, no matter if they are positive or negative C-multipliers, they all suffer similar problems of the above given example circuit of previous art. Moreover, they are prone to deviate strongly from ideal under certain circumstances. For instance, in the above cited previous art circuit of "Realizations of Grounded Negative Capacitance Using CFOAs", A. Lahiri and M. Gupta, Circuits Systems and Signal Processing 30: 143-155, 2011, $R_2=R_X$ becomes critical condition. It has been observed that deviation from ideal capacitance can be more severe for some other previous art circuits.

Current Feedback Amplifiers:

Operational Amplifiers (opamps) are widely used and well known building blocks. From the circuit theory point of view, an opamp is modeled by a voltage controlled voltage source (VCVS) which accepts voltages as their input.

By using a different architecture for the input stage of the operational amplifier, which accepts currents as their input, a substantial improvement in their performance may be achieved and this structure is named as current feedback operational, amplifier (CFOA) also known as the transimpedance operational amplifiers.

Symbolic representation of a CFOA 14 is shown in FIG. 2A. Internal structure of a CFOA 14 comprises a CCII (second generation current conveyor) 6 which can be either one of a positive or negative type, and an output buffer stage 7, as shown in FIG. 2B. The CFOA is a four-terminal active building block and described by the following matrix equation, $$\begin{bmatrix} V_x \\ I_y \\ I_z \\ V_W \end{bmatrix} = \begin{bmatrix} 0 & 1 & 0 & 0 \\ 0 & 0 & 0 & 0 \\ \pm 1 & 0 & 0 & 0 \\ 0 & 0 & 1 & 0 \end{bmatrix} \begin{bmatrix} I_x \\ V_y \\ V_z \\ V_w \end{bmatrix} \quad \text{(Equation 5)}$$

The input signal of an (ideal) current conveyor is current; therefore, the input impedance at terminal X of an ideal CFOA is zero. The Y terminal (the non-inverting input of said element) has very high input impedance. The two outputs Z and W have very high and very low output impedance, respectively.

U.S. Pat. No. 7,388,432 B1 (2008) by Gert Jan van Sprakelaar teaches on Current feedback amplifiers with extended common mode input range. Recently, an integrated, fully-differential current feedback trans impedance operational amplifier circuit is disclosed in U.S. Pat. No. 9,236,841 B2 (2016) by Ciubotaru.

CFOA Based Capacitance Multipliers of Previous Art:

Although there are many examples of grounded and floating inductors published in literature related to the application of CFOAs, there are only few papers related to CFOA based emulations of grounded C-multipliers.

Inspection of these earlier works related to said subject shows that; the circuit presented in FIG. 4, 33a in the book published b R. Senani et, al, employs 5 passive components and a CFOA and has a serious drawback of necessitating component, matching of two resistors and two capacitors used in the circuit in "Current Feedback Operational Amplifiers and Their Applications", Springer Science and Business Media, New York 2013. A paper by M. T. Abuelma'atti and S. K. Dhar of "New CFOA based floating immittance emulators", International Journal of Electronics, 103, 12, 1984-1997, 2016, and a recent U.S. Pat. No. 9,548,721, 17 Jan. 2017, introduces both lossless and lossy floating capacitance emulators employing three CFOAs and three passive components. R. Arslanalp and T. Yucehan describe a grounded CFOA-based capacitance multiplier, with a negative relationship between input and compensation terminal currents in "Capacitance multiplier design by using CFOA", 23rd Signal Processing and Communications Applications Conference (SIU), 16-19 May 2015. Their report on circuit simulation results reveals that said circuit has large capacitance deviations for increased values of multiplier coefficients. A paper by A. Khan et. al. presents a C-multiplier using a CFOA in "Current conveyor based R and C-multiplier circuits". AEU, Int. J. Electron. Commun. 56 (5), 312-316, 2002. However, it includes an additional current conveyor element, therefore is not a (minimal) single CFOA based circuit.

SUMMARY OF THE INVENTION

The main objective of the present patent application disclosed herein is to realize a C-multiplier circuit which is suitable for monolithic integration using CMOS technology and single operational amplifier, and minimum number of passive components, free from lossy terms, therefore simulating a pure capacitance with an amplified value.

The Capacitance Multiplier circuit disclosed in the present application comprises;
a current feedback operational amplifier (CFOA) having input terminals (inverting input x-terminal and a noninverting input y-terminal) and output terminals (w-terminal and z-terminal), a first resistor, a second resistor and a reference capacitor. In the Capacitance Multiplier circuit the noninverting input y-terminal of CFOA is grounded while the inverting input x-terminal of said element is connected to one end of the capacitor which is the reference capacitor the capacitance of which is to be multiplied by a constant k, the other end of the capacitor is connected to an input node that end which is connected to the input node is also connected to one end of the first resistor the other end of which is connected to the z-terminal of CFOA while said end of the reference capacitor which is connected to the input node is also connected to one end of the second resistor the other end of which is in connection with the output w-terminal of CFOA, so that the amplified capacitance value of the capacitance multiplier circuit is the value of impedance seen between the input node and the ground.

In one embodiment of the present invention a plus type current conveyor within the active element (CFOA) is employed. Therefore, the amplified capacitance value equals the reference capacitance multiplied by a constant k determined by the ratio of the resistance values of the first resistor to second resistor.

In another embodiment, the current relationship between x and z terminals of the CFOA are internally reversed as Ix=-Iz by internal modification of the CFOA at transistor level which yields a negative capacitance multiplier circuit. In this embodiment, the amplified capacitance value equals minus 1 times the reference capacitance multiplied by a constant k determined by the ratio of the resistance values of the first resistor to second resistor.

Compared to the prior patents, the capacitance multiplier circuit of the present invention uses single current feedback amplifier (CFOA). Thus, a small physical capacitance is increased in its value to a virtual capacitor having larger capacitance value.

Since the input terminal of proposed circuit is internally grounded, this eliminates many parasitic effects, injected noise and capacitances that are present in conventional operational amplifier structures.

Advantages of C-multipliers of present invention are better understood when they are compared with previous art. C-Multipliers, operating under same conditions (i.e., constructed using same CFOA element and simulating the same ideal capacitance value). For example, in the negative C-multiplier circuit shown in FIG. 5 (circuit D in "Realizations of Grounded Negative Capacitance Using CFOAs", Circuits Systems and Signal Processing 30: 143-155, 2011) of Lahiri and Gupta, a parasitic resistance term is included in ideal negative capacitance equation, and negative resistance term is included in the input impedance equation of their proposed circuit. In the present invention, the values of C-multiplier coefficients (k values) of both preferred embodiments remain the same under ideal and non-ideal conditions, and both are free from parasitic resistance term at X terminal. An additional fractional resistive term has insignificant influence on circuit performance for both of the preferred embodiments of present invention, particularly at higher values of k.

Additionally, basic capacitance multiplier topology of the present invention employs minimum number of components so that the manufacturing cost of these circuits is reduced, and the circuit structure becomes simpler and their size can be decreased. All of these advantages will provide the market competitiveness of the capacitance multiplier circuits presented in this patent application.

Therefore, objective of this invention is to provide circuits for hardware (on chip) simulation of an effective capacitor value (which is much greater than that of included physical capacitance) by employing a single CFOA as an active element, and only three passive components (minimum configuration).

The present patent application presents CFOA based circuit topologies to realize grounded capacitance and grounded negative capacitance multiplier circuits while keeping in mind the limitations in their construction using CMOS or bipolar transistors, in various forms. The purpose of discussing internal structure developments of CFOA herein is merely to show that much progress has been made since the first introduction of the theory of said element and it is possible to design and realize said element in CMOS or bipolar technology so that realization of said element approaches its best possible form. Therefore, description of internal design of said element at CMOS or bipolar transistor level is not the objective of present invention.

BRIEF DESCRIPTION OF DRAWINGS

The system and method developed to fulfill the objectives of the present invention is illustrated in the accompanying figures, in which:

FIG. 1A is a lossy capacitance multiplier circuit of previous art.

FIG. 1B is equivalent (emulated) lossy capacitance multiplier circuit of FIG. 1A.

FIG. 2A is a symbolic representation of Current Feedback Operational Amplifier (CFOA) internally using a plus type second generation current conveyor.

FIG. 2B is internal structure of a conventional CFOA consists of a second generation current conveyor of positive type followed by a unity gain voltage buffer section.

FIG. 3A is a Capacitance Multiplier circuit using single CFOA.

FIG. 3B is grounded equivalent circuit capacitance of the circuit of FIG. 3A, ideally without any lossy component.

DETAILED DESCRIPTION OF THE INVENTION

First preferred embodiment of the present invention is displayed in FIG. 3A. The capacitance multiplier circuit comprises; a current feedback operational amplifier (CFOA) 14 having x, y, z and w-terminal and in which a plus type current conveyor (CCII+) is employed; a capacitor 11 having a first end connected to the x-terminal of the CFOA 14 and a second end connected to an input node 15; a first resistor 12 having a first end connected to the z-terminal of the CFOA 14 and a second end connected to the second end of the capacitor 11; a second resistor 13 having a first end connected to the w-terminal of the CFOA 14 and a second end connected to the second end of the first resistor 12.

In this embodiment, either the first resistor 12 or the second resistor 13 or both of said resistors can be constructed as different types of resistor such as voltage or current controlled resistor.

Here, equivalent input impedance of the Capacitance Multiplier circuit 10 is a pure (lossless) capacitance 40 without any lossy component, as shown in FIG. 3B and it amplifies a reference capacitance of the reference capacitor 11 by a large constant value k which is determined by the ratio of other passive components 12 and 13, as described herein.

Input impedance $Z_i$ of the circuit 10 shown in FIG. 3 is calculated in ideal case as $$Z_i(s) = \frac{R_2}{C(R_1 + 2R_2)s} \quad \text{(Equation 6)}$$

where, s is complex frequency term (Laplace operator). From this equation it is apparent that the new (simulated) capacitance 40 is $$C_{eq} = kC \quad \text{(Equation 7)}$$

This value is a multiple of physical capacitance, C by a factor specified as k in FIG. 3B, $$k = \frac{R_1}{R_2} + 2 \quad \text{(Equation 8)}$$

In the second preferred embodiment, a Capacitance Multiplier circuit 10 comprises; a current feedback operational amplifier (CFOA) 14 having x, y, z and w-terminal and in which a minus type current conveyor (CCII−) is employed; a capacitor 11 having a first end connected to the x-terminal of the current feedback operational amplifier 14 and a second end connected to an input node 15; a first resistor 12 having a first end connected to the z-terminal of the current feedback operational amplifier 14 and a second end connected to the second end of the capacitor 11; a second resistor 13 having a first end connected to the w-terminal of the current feedback operational 14 and a second end connected to the second end of the first resistor 12.

In this embodiment, either the first resistor 12 or the second resistor 13 or both of said resistors can be constructed as different types of resistor such as voltage or current controlled resistor.

The second preferred embodiment of this patent application has the same circuit topology as shown in FIG. 3A. However, in this embodiment a minus type current conveyor (CCII−) within the active element (CFOA 14) is employed. This changes the relationship between currents entering into x and z terminals of the CFOA 14. While this has positive relationship for the circuit of first preferred embodiment ($I_z=I_x$), in the second preferred embodiment said relationship is negative. In other words, in the second embodiment, current enters into input X terminal, and equal amount of current leaves the Z terminal of CFOA ($I_z=-I_x$).

At transistor level, this operation of changing current sign at Z terminal can be easily accomplished internally within the CFOA 14, particularly within CCII (for example) by a simple manipulation on bias currents and/or changing transistor polarities of current mirrors.

This will cause a different input impedance equation than the one described above, which yields the simulated negative capacitance Value of $$C_{eq} = -kC \quad \text{(Equation 9)}$$

which has the equivalent value of multiplier k, $$k = \frac{R_1}{R_2} \quad \text{(Equation 10)}$$

in FIG. 3B, in said circuit of second preferred embodiment.

It should be noted here that while employing a single ideal operational amplifier results inevitably in a lossy capacitance simulation, single ideal CFOA based C-multiplier circuits such as the ones mentioned herein possess lossless ideal structures.

Above given equations have been obtained assuming ideal CFOAs. However, like any other active element, CFOAs suffer from some non-idealities. These are current and voltage tracking errors, the parasitic components at the ports of the element, besides the non-linear trans-impedance characteristics. These will cause additional terms to appear in the expressions stated above.

Although the current gain between the currents in ports Z and X, the voltage gains between the voltages at ports X and Y and W and Z are not exactly unity, these tracking errors are practically negligible, therefore, additional unwanted terms due to these errors may be disregarded.

Since only a resistor (the second resistor 13) is externally connected to terminal W, the effect of the parasitic resistance $R_W$ can be absorbed into the externally connected resistance. Because a capacitance 11 is connected in series with terminal X, the new equation of input impedance $Z_i$ for the first preferred embodiment becomes $$Z_i(s) = \frac{R_2}{C(R_1 + 2R_2)s} + \frac{R_2 R_x}{R_1 + 2R_2} = \frac{1}{Cks} + \frac{R_x}{k}, \quad \text{(Equation 11)}$$

$$k = \frac{R_1}{R_2} + 2$$

Where $R_x$ is termed as the non-ideal internal input resistance at terminal X (which is named also as the inverting terminal of the CFOA 14), while the new equation of input impedance Zi for the second preferred embodiment is $$Z_i(s) = -\frac{R_2}{CR_1 s} - \frac{R_2 R_x}{R_1} = -\frac{1}{Cks} - \frac{R_x}{k}, \quad \text{(Equation 12)}$$

$$k = \frac{R_1}{R_2}$$

In other words, values of C-multiplier coefficients (k values) of both preferred embodiments remain the same.

In the Capacitance Multiplier circuit 10 of first preferred embodiment, only a fractional resistive term is added which has insignificant influence particularly at higher values of k. (For example, if k=10, added new resistive term will have a value of Rx/10). In the Capacitance Multiplier circuit 10 of second preferred embodiment, only a fractional negative resistance term enters the equation of ideal input impedance Zi which has insignificant influence particularly at higher values of k. (For example, if k=10, parasitic term will have a value of minus Rx/10).

The input resistance at terminal X of a non-ideal CFOA is not zero but has a value of Rx. In order to reduce inherent input resistance of CFOAs, several improvements can be accomplished at transistor level. For example, in a CMOS structure of said element, the aspect ratio and bias current of transistors can be designed as larger ones to achieve higher transconductance ($g_m$) values for these transistors, and consequently lower values of Rx. There are several other techniques that have been reported in literature to reduce the input resistance at terminal X of a non-ideal CFOA. For example, Eyad Abou-Allam presents a circuit which uses feedback so that the input resistance is reduced by (1+Av) times, where Av is the gain in "A 200 MHz Steered Current Operational Amplifier in 1.2 μm CMOS Technology", IEEE Journal of Solid-State Circuits, Vol. 32, No. 2, February 1997. U.S. Pat. No. 6,492,871 B2 (2000) granted to Liu and Liao also discloses more on this kind of successful circuit improvements.

When combined with these improvement techniques, added resistance to ideal input impedance equation (or added negative resistance magnitude) which equals (Rx/k) in both cases (with different equivalent values due to different defining equations of coefficient term k) will be farther reduced to insignificant resistance levels.

Since terminal Y of CFOA 14 is kept at ground potential in the Capacitance Multiplier circuit 10 topology common to both first and second preferred embodiments of the present invention, parasitic impedance at terminals Y can also be ignored. It should be remarked here that it is the unique circuit topology presented herein that provides such an advantage as compared to other C-multipliers of both positive and negative types of previous art.

By virtue of any CFOA structure, parasitics at Z terminal cannot be absorbed in any externally connected components, which imposes a high frequency limit of operation; however, this limit is still substantially higher than the frequency limit of operational amplifier based C-multipliers.

Considering the non-linearities of current-voltage and voltage-voltage characteristics of the CFOAs (that are due to the non-linear performance of the current mirrors and the translinear loop of the CFOA), performances of the proposed C-multiplier circuits 10 are improved in contrast to previous art C-multipliers, since Y terminal of said element is at ground potential, and there is no way of reaching saturation.

It is possible that, presented circuit topology for both preferred embodiments of this invention can be modified to simulate current/voltage-tunable C-multipliers. Because of the presence of a virtual ground at inverting input terminal of CFOA, a CMOS floating variable resistor circuit can be employed for either one of the resistors involved in the presented C-multiplier topology presented herein by employing alternative floating types of variable resistors that have been reported earlier, such as, by S. Sakurai and M. Ismail in "A CMOS Square-Law Programmable Floating Resistor Independent of the Threshold Voltage", IEEE Trans. on Circuits and Systems, 39 (8): 565-574, August 1992; or by S. Al-Sarawi iri "New current-controlled very high value floating CMOS resistor", Proceedings of SPIE—The International Society for Optical Engineering 4591, November 2001; or by M. Kushima et. al. in "Design of a Floating Node Voltage-Controlled Linear Variable Resistor Circuit", The 47h IEEE International Midwest Symposium on Circuits and Systems, p—85-88, 2004.

What is claimed is:

1. A capacitance multiplier circuit, consisting of:
   a current feedback operational amplifier having an x-terminal, a y-terminal, a z-terminal and a w-terminal, wherein a plus type current conveyor within the current feedback operational amplifier is provided;
   a capacitor having a first end of the capacitor connected to the x-terminal of the current feedback operational amplifier and a second end of the capacitor connected to an input node;
   a first resistor having a first end of the first resistor connected to the z-terminal of the current feedback operational amplifier and a second end of the first resistor connected to the second end of the capacitor; and
   a second resistor having a first end of the second resistor connected to the w-terminal of the current feedback operational amplifier and a second end of the second resistor connected to the second end of the first resistor, wherein the y-terminal is directly connected to a ground.

2. The capacitance multiplier circuit according to claim 1, wherein at least one of the first resistor or the second resistor is constructed as voltage controlled resistor.

3. The capacitance multiplier circuit according to claim 1, wherein at least one of the first resistor or the second resistor is constructed as current controlled resistor.

4. A capacitance multiplier circuit, consisting of:
   a current feedback operational amplifier having an x-terminal, a y-terminal, a z-terminal and a w-terminal, wherein a negative type current conveyor within the current feedback operational amplifier is provided;
   a capacitor having a first end of the capacitor connected to the x-terminal of the current feedback operational amplifier and a second end of the capacitor connected to an input node;
   a first resistor having a first end of the first resistor connected to the z-terminal of the current feedback operational amplifier and a second end of the first resistor connected to the second end of the capacitor; and
   a second resistor having a first end of the second resistor connected to the w-terminal of the current feedback operational amplifier and a second end of the second resistor connected to the second end of the first resistor, wherein the y-terminal is directly connected to a ground.

5. The capacitance multiplier circuit according to claim 4, wherein at least one of the first resistor or the second resistor is constructed as voltage controlled resistor.

6. The capacitance multiplier circuit according to claim 4, wherein at least one of the first resistor or the second resistor is constructed as current controlled resistor.

* * * * *